(12) United States Patent
Cao

(10) Patent No.: US 8,723,610 B2
(45) Date of Patent: May 13, 2014

(54) VOLTAGE CONTROLLED OSCILLATOR

(75) Inventor: Zhiheng Cao, Aliso Viejo, CA (US)

(73) Assignee: Broadcom Corporation, Irvine, CA (US)

( * ) Notice: Subject to any disclaimer, the term of this patent is extended or adjusted under 35 U.S.C. 154(b) by 110 days.

(21) Appl. No.: 13/559,869

(22) Filed: Jul. 27, 2012

(65) Prior Publication Data

US 2014/0028406 A1    Jan. 30, 2014

(51) Int. Cl.
*H03B 5/12* (2006.01)
(52) U.S. Cl.
CPC .......... *H03B 5/1212* (2013.01); *H03B 5/1228* (2013.01); *H03B 5/1234* (2013.01); *H03B 2200/0062* (2013.01); *H03B 2200/0082* (2013.01); *H03B 2202/06* (2013.01)
USPC .......... 331/117 FE; 331/109; 331/185; 331/183
(58) Field of Classification Search
CPC .......... H03B 5/02; H03B 5/04; H03B 5/12; H03B 5/1206; H03B 5/1212; H03B 5/1215; H03B 5/1228; H03B 5/1234; H03B 5/129; H03B 2200/0036; H03B 2200/0062; H03B 2200/0082; H03B 2202/06
USPC ........ 331/117 R, 117 FE, 167, 109, 182, 185, 331/186
See application file for complete search history.

(56) References Cited

U.S. PATENT DOCUMENTS

| 6,064,277 | A  | * | 5/2000  | Gilbert .................... 331/117 R |
| 6,909,336 | B1 | * | 6/2005  | Rajagopalan et al. ........ 331/183 |
| 7,230,505 | B2 | * | 6/2007  | Rachedine et al. ........... 331/179 |
| 8,076,985 | B2 | * | 12/2011 | Tsukizawa .................... 331/176 |

OTHER PUBLICATIONS

Fanori, Luca et al., "Dynamic bias schemes for class-C VCOs." NORCHIP, Nov. 14-15, 2011, pp. 1-4.*
Deng et al., "A feedback class-C VCO with robust startup condition over PVT variations and enhanced oscillation swing" ESSCIRC (ESSCIRC), 2011 Proceedings of the. IEEE, Sep. 12-16, 2011, pp. 499-502.*
Mazzanti, Andrea, "Class-C Harmonic CMOS VCOs, With a General Result on Phase Noise," IEEE Journal of Solid-State Circuits, vol. 43, No. 12, Dec. 2008.

* cited by examiner

*Primary Examiner* — Ryan Johnson
(74) *Attorney, Agent, or Firm* — Garlick & Markison; Randy W. Lacasse

(57) ABSTRACT

A bias loop is used to program LC tank common mode voltage to allow operation at two different supply voltages VDD (e.g., 2.5V and 1.2V), and two different tank swings. This also allows lower phase noise through optimizing Ids shape allowing class C operation for both voltages. The two different supply voltages allow operation using multiple communication protocols such as 802.11n and 802.11ac within a common VCO circuit. The VCO can form part of a transceiver to provide frequencies in multiple bands.

20 Claims, 14 Drawing Sheets

VOLTAGE CONTROLLED OSCILLATOR

The following IEEE standards/draft standards are hereby incorporated herein by reference in their entirety and are made part of the present U.S. Utility Patent Application for all purposes:

1. IEEE Std 802.11™—2012, "IEEE Standard for Information technology—Telecommunications and information exchange between systems—Local and metropolitan area networks—Specific requirements; Part 11: Wireless LAN Medium Access Control (MAC) and Physical Layer (PHY) Specifications," IEEE Computer Society, Sponsored by the LAN/MAN Standards Committee, IEEE Std 802.11™—2012, (Revision of IEEE Std 802.11—2007), 2793 total pages (incl. pp. i-xcvi, 1-2695).

2. IEEE Std 802.11n™—2009, "IEEE Standard for Information technology—Telecommunications and information exchange between systems—Local and metropolitan area networks—Specific requirements; Part 11: Wireless LAN Medium Access Control (MAC) and Physical Layer (PHY) Specifications; Amendment 5: Enhancements for Higher Throughput," IEEE Computer Society, IEEE Std 802.11n™—2009, (Amendment to IEEE Std 802.11™—2007 as amended by IEEE Std 802.11k™—2008, IEEE Std 802.11r™—2008, IEEE Std 802.11y™—2008, and IEEE Std 802.11r™—2009), 536 total pages (incl. pp. i-xxxii, 1-502).

3. IEEE Draft P802.11-REVmb™/D12, November 2011 (Revision of IEEE Std 802.11™—2007 as amended by IEEE Std 802.11k™—2008, IEEE Std 802.11r™—2008, IEEE Std 802.11y™—2008, IEEE Std 802.11w™—2009, IEEE Std 802.11n™—2009, IEEE Std 802.11p™—2010, IEEE Std 802.11z™—2010, IEEE Std 802.11v™-2011, IEEE Std 802.11u™—2011, and IEEE Std 802.11s™—2011), "IEEE Standard for Information technology—Telecommunications and information exchange between systems—Local and metropolitan area networks—Specific requirements; Part 11: Wireless LAN Medium Access Control (MAC) and Physical Layer (PHY) Specifications," Prepared by the 802.11 Working Group of the LAN/MAN Standards Committee of the IEEE Computer Society, 2910 total pages (incl. pp. i-cxxviii, 1-2782).

4. IEEE P802.11ac™/D2.1, March 2012, "Draft STANDARD for Information Technology—Telecommunications and information exchange between systems—Local and metropolitan area networks—Specific requirements, Part 11: Wireless LAN Medium Access Control (MAC) and Physical Layer (PHY) specifications, Amendment 4: Enhancements for Very High Throughput for Operation in Bands below 6 GHz," Prepared by the 802.11 Working Group of the 802 Committee, 363 total pages (incl. pp. i-xxv, 1-338).

5. IEEE P802.11ad™/D6.0, March 2012, (Draft Amendment based on IEEE P802.11REVmb D12.0), (Amendment to IEEE P802.11REVmb D12.0 as amended by IEEE 802.11ae D8.0 and IEEE 802.11aa D9.0), "IEEE P802.11ad™/D6.0 Draft Standard for Information Technology—Telecommunications and Information Exchange Between Systems—Local and Metropolitan Area Networks—Specific Requirements—Part 11: Wireless LAN Medium Access Control (MAC) and Physical Layer (PHY) Specifications—Amendment 3: Enhancements for Very High Throughput in the 60 GHz Band," Sponsor: IEEE 802.11 Committee of the IEEE Computer Society, IEEE-SA Standards Board, 664 total pages.

6. IEEE Std 802.11ae™—2012, "IEEE Standard for Information technology—Telecommunications and information exchange between systems—Local and metropolitan area networks—Specific requirements; Part 11: Wireless LAN Medium Access Control (MAC) and Physical Layer (PHY) Specifications," "Amendment 1: Prioritization of Management Frames," IEEE Computer Society, Sponsored by the LAN/MAN Standards Committee, IEEE Std 802.11ae™-2012, (Amendment to IEEE Std 802.11™-2012), 52 total pages (incl. pp. i-xii, 1-38).

7. IEEE P802.11af™/D1.06, March 2012, (Amendment to IEEE Std 802.11REVmb™/D12.0 as amended by IEEE Std 802.11ae™/D8.0, IEEE Std 802.11aa™/D9.0, IEEE Std 802.11ad™/D5.0, and IEEE Std 802.11ac™/D2.0), "Draft Standard for Information Technology—Telecommunications and information exchange between systems—Local and metropolitan area networks—Specific requirements—Part 11: Wireless LAN Medium Access Control (MAC) and Physical Layer (PHY) Specifications—Amendment 5: TV White Spaces Operation," Prepared by the 802.11 Working Group of the IEEE 802 Committee, 140 total pages (incl. pp. i-xxii, 1-118)

BACKGROUND OF THE INVENTION

1. Technical Field of the Invention

This invention relates generally to wireless communications and more particularly to circuits used to support wireless communications.

2. Description of Related Art

Communication systems are known to support wireless and wireline communications between wireless and/or wireline communication devices. Such communication systems range from national and/or international cellular telephone systems to the Internet to point-to-point in-home wireless networks to radio frequency identification (RFID) systems. Each type of communication system is constructed, and hence operates, in accordance with one or more communication standards. For instance, wireless communication systems may operate in accordance with one or more standards including, but not limited to, 3GPP, LTE, LTE Advanced, RFID, IEEE 802.11, Bluetooth, advanced mobile phone services (AMPS), digital AMPS, global system for mobile communications (GSM), code division multiple access (CDMA), local multi-point distribution systems (LMDS), multi-channel-multi-point distribution systems (MMDS), and/or variations thereof.

Depending on the type of wireless communication system, a wireless communication device, such as a cellular telephone, two-way radio, personal digital assistant (PDA), personal computer (PC), laptop computer, home entertainment equipment, RFID reader, RFID tag, et cetera communicates directly or indirectly with other wireless communication devices. For direct communications (also known as point-to-point communications), the participating wireless communication devices tune their receivers and transmitters to the same channel or channels (e.g., one of the plurality of radio frequency (RF) carriers of the wireless communication system) and communicate over that channel(s). For indirect wireless communications, each wireless communication device communicates directly with an associated base station (e.g., for cellular services) and/or an associated access point (e.g., for an in-home or in-building wireless network) via an assigned channel. To complete a communication connection between the wireless communication devices, the associated base stations and/or associated access points communicate with each other directly, via a system controller, via the public switch telephone network, via the Internet, and/or via some other wide area network.

For each wireless communication device to participate in wireless communications, it includes a built-in radio transceiver (i.e., receiver and transmitter) or is coupled to an associated radio transceiver (e.g., a station for in-home and/or in-building wireless communication networks, RF modem, etc.). As is known, the receiver is coupled to one or more antennas (e.g., MIMO) and may include one or more low noise amplifiers, one or more intermediate frequency stages, a filtering stage, and a data recovery stage. The low noise amplifier(s) receives inbound RF signals via the antenna and amplifies them. The one or more intermediate frequency stages mix the amplified RF signals with one or more local oscillations to convert the amplified RF signal into baseband signals or intermediate frequency (IF) signals. The filtering stage filters the baseband signals or the IF signals to attenuate unwanted out of band signals to produce filtered signals. The data recovery stage recovers raw data from the filtered signals in accordance with the particular wireless communication standard.

As is also known, the transmitter includes a data modulation stage, one or more intermediate frequency stages, and a power amplifier. The data modulation stage converts raw data into baseband signals in accordance with a particular wireless communication standard. The one or more intermediate frequency stages mix the baseband signals with one or more local oscillations to produce RF signals. The power amplifier amplifies the RF signals prior to transmission via an antenna.

Currently, wireless communications occur within licensed or unlicensed frequency spectrums. For example, wireless local area network (WLAN) communications occur within the unlicensed Industrial, Scientific, and Medical (ISM) frequency spectrum of 900 MHz, 2.4 GHz, and 5 GHz. While the ISM frequency spectrum is unlicensed there are restrictions on power, modulation techniques, and antenna gain. Another unlicensed frequency spectrum is the V-band of 55-64 GHz.

Disadvantages of conventional approaches will be evident to one skilled in the art when presented in the disclosure that follows.

BRIEF SUMMARY OF THE INVENTION

The technology described herein is directed to an apparatus and methods of operation that are further described in the following Brief Description of the Drawings and the Detailed Description of the Invention. Other features and advantages will become apparent from the following detailed description made with reference to the accompanying drawings.

BRIEF DESCRIPTION OF THE SEVERAL VIEWS OF THE DRAWING(S)

DETAILED DESCRIPTION OF THE INVENTION

Figure 1:
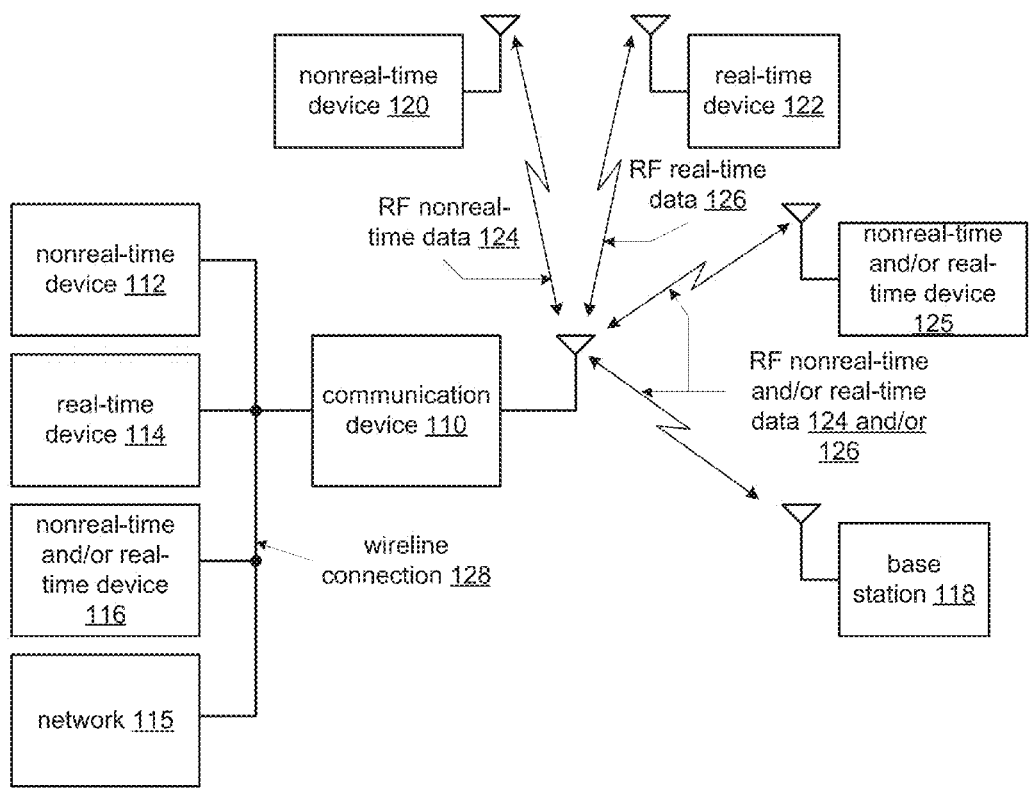
FIG. 1 is a schematic block diagram of an embodiment of a wireless communication system.

FIG. 1 is a schematic block diagram of a communication system in accordance with the technology described herein. In particular, a communication system is shown that includes a communication device 110 that communicates real-time data 126 and/or non-real-time data 124 wirelessly with one or more other devices such as base station 118, non-real-time device 120, real-time device 122, and non-real-time and/or real-time device 125. In addition, communication device 110 can also optionally communicate over a wireline connection with network 115, non-real-time device 112, real-time device 114, and non-real-time and/or real-time device 116.

In an embodiment of the present invention the wireline connection 128 can be a wired connection that operates in accordance with one or more standard protocols, such as a universal serial bus (USB), Institute of Electrical and Electronics Engineers (IEEE) 488, IEEE 1394 (Firewire), Ethernet, small computer system interface (SCSI), serial or parallel advanced technology attachment (SATA or PATA), or other wired communication protocol, either standard or proprietary. The wireless connection can communicate in accordance with a wireless network protocol such as WiHD, NGMS, IEEE 802.11a, ac, b, g, n, or other 802.11 standard protocol, Bluetooth, Ultra-Wideband (UWB), WIMAX, or other wireless network protocol, a wireless telephony data/voice protocol such as Global System for Mobile Communications (GSM), General Packet Radio Service (GPRS), Enhanced Data Rates for Global Evolution (EDGE), Personal Communication Services (PCS), or other mobile wireless protocol or other wireless communication protocol, either standard or proprietary. Further, the wireless communication path can include separate transmit and receive paths that use separate carrier frequencies and/or separate frequency channels. Alternatively, a single frequency or frequency channel can be used to bi-directionally communicate data to and from the communication device 110.

Communication device 110 can be a mobile phone such as a cellular telephone, a local area network device, personal area network device or other wireless network device, a personal digital assistant, game console, personal computer, laptop computer, or other device that performs one or more functions that include communication of voice and/or data via wireline connection 128 and/or the wireless communication path. Further communication device 110 can be an access point, base station or other network access device that is coupled to a network 115 such at the Internet or other wide area network, either public or private, via wireline connection 128. In an embodiment of the present invention, the real-time and non-real-time devices 112, 114 116, 118, 120, 122 and 125 can be personal computers, laptops, PDAs, mobile phones, such as cellular telephones, devices equipped with wireless local area network or Bluetooth transceivers, FM tuners, TV tuners, digital cameras, digital camcorders, or other devices that either produce, process or use audio, video signals or other data or communications.

In operation, the communication device includes one or more applications that include voice communications such as standard telephony applications, voice-over-Internet Protocol (VoIP) applications, local gaming, Internet gaming, email, instant messaging, multimedia messaging, web browsing, audio/video recording, audio/video playback, audio/video downloading, playing of streaming audio/video, office applications such as databases, spreadsheets, word processing, presentation creation and processing and other voice and data applications. In conjunction with these applications, the real-time data 126 includes voice, audio, video and multimedia applications including Internet gaming, etc. The non-real-time data 124 includes text messaging, email, web browsing, file uploading and downloading, etc.

In an embodiment of the present invention, the communication device 110 includes a wireless transceiver that includes one or more features or functions of the present invention. Such wireless transceivers shall be described in greater detail in association with FIGS. 5-21 that follow.

Figure 2:
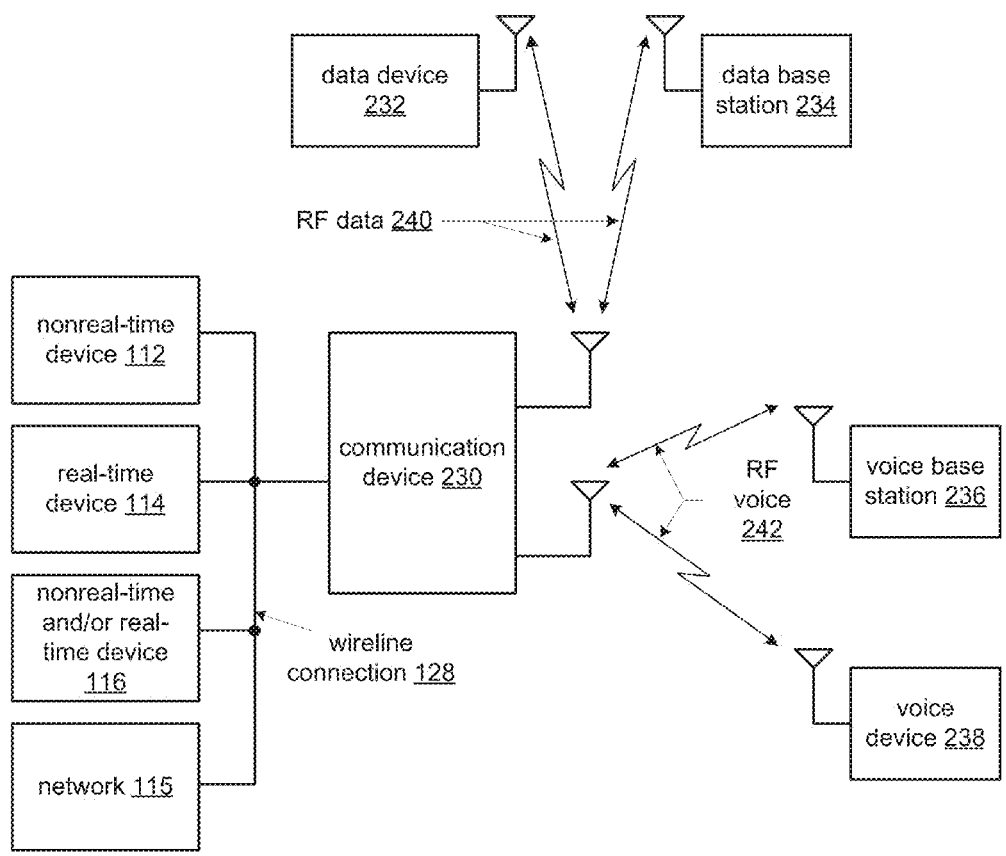
FIG. 2 is a schematic block diagram of another embodiment of a wireless communication system.

FIG. 2 is a schematic block diagram of an embodiment of another communication system in accordance with the present invention. In particular, FIG. 2 presents a communication system that includes many common elements of FIG. 1 that are referred to by common reference numerals. Communication device 230 is similar to communication device 110 and is capable of any of the applications, functions and features attributed to communication device 110, as discussed in conjunction with FIG. 1. However, communication device 230 includes two or more separate wireless transceivers for communicating, contemporaneously, via two or more wireless communication protocols with data device 232 and/or data base station 234 via RF data 240 and voice base station 236 and/or voice device 238 via RF voice signals 242.

Figure 3:
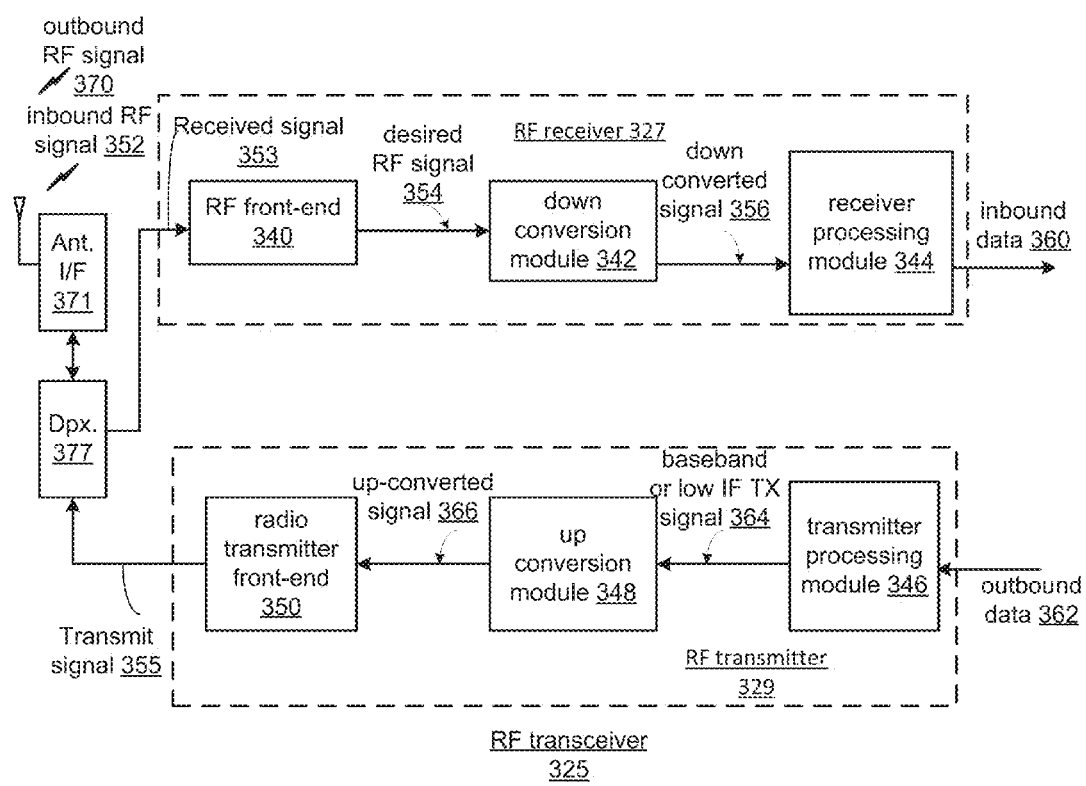
FIG. 3 is a schematic block diagram of an RF transceiver for a wireless communication system.

FIG. 3 is a schematic block diagram of an embodiment of a wireless transceiver 325 in accordance with the present invention. The RF transceiver 325 represents a wireless transceiver for use in conjunction with communication devices 110 or 230, base station 118, non-real-time device 120, real-time device 122, and non-real-time, real-time device 125, data device 232 and/or data base station 234, and voice base station 236 and/or voice device 238. RF transceiver 325 includes an RF transmitter 329, and an RF receiver 327. The RF receiver 327 includes a RF front end 340, a down conversion module 342 and a receiver processing module 344. The RF transmitter 329 includes a transmitter processing module 346, an up conversion module 348, and a radio transmitter front-end 350.

Figure 4:
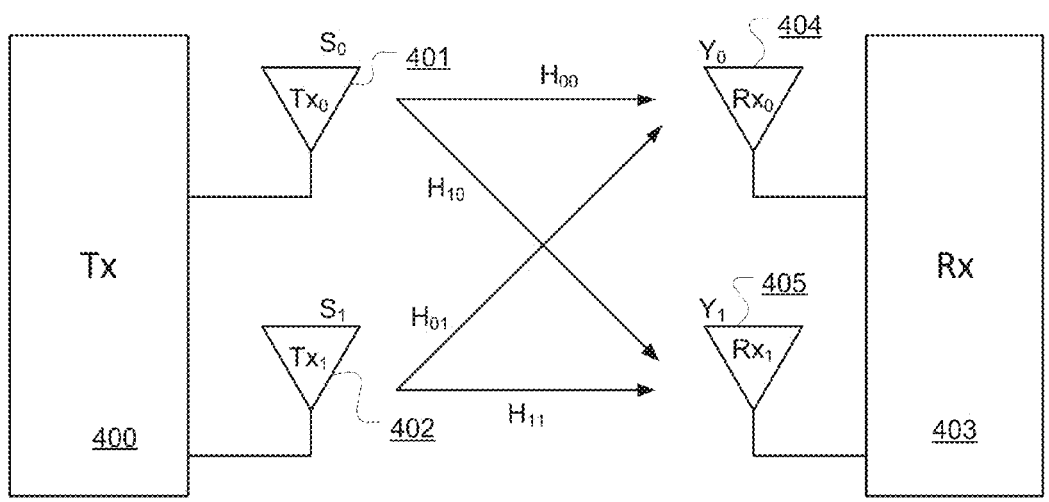
FIG. 4 is a schematic block diagram of a simple two antenna MIMO structure.

As shown, the receiver and transmitter are each coupled to an antenna through an antenna interface 371 and a diplexer (duplexer) 377, that couples the transmit signal 355 to the antenna to produce outbound RF signal 370 and couples inbound signal 352 to produce received signal 353. Alternatively, a transmit/receive switch can be used in place of diplexer 377. While a single antenna is represented in FIG. 3, the receiver and transmitter may share a multiple antenna structure that includes two or more antennas as shown in FIG. 4, discussed in greater detail hereafter.

In operation, the RF transmitter 329 receives outbound data 362. The transmitter processing module 346 packetizes outbound data 362 in accordance with a millimeter wave protocol or wireless telephony protocol, either standard or proprietary, to produce baseband or low intermediate frequency (IF) transmit (TX) signals 364 that includes an outbound symbol stream that contains outbound data 362. The baseband or low IF TX signals 364 may be digital baseband signals (e.g., have a zero IF) or digital low IF signals, where the low IF typically will be in a frequency range of one hundred kilohertz to a few megahertz. Note that the processing performed by the transmitter processing module 346 can include, but is not limited to, scrambling, encoding, puncturing, mapping, modulation, and/or digital baseband to IF conversion.

The up conversion module 348 includes a digital-to-analog conversion (DAC) module, a filtering and/or gain module, and a mixing section. The DAC module converts the baseband or low IF TX signals 364 from the digital domain to the analog domain. The filtering and/or gain module filters and/or adjusts the gain of the analog signals prior to providing it to the mixing section. The mixing section converts the analog baseband or low IF signals into up-converted signals 366 based on a transmitter local oscillation.

The radio transmitter front end 350 includes a power amplifier and may also include a transmit filter module. The power amplifier amplifies the up-converted signals 366 to produce outbound RF signals 370, which may be filtered by the transmitter filter module, if included. The antenna structure transmits the outbound RF signals 370 via an antenna interface 371 coupled to an antenna that provides impedance matching and optional band pass filtration.

The RF receiver 327 receives inbound RF signals 352 via the antenna and antenna interface 371 that operates to process the inbound RF signal 352 into received signal 353 for the receiver front-end 340. In general, antenna interface 371 provides impedance matching of antenna to the RF front-end 340, optional band pass filtration of the inbound RF signal 352.

The down conversion module 342 includes a mixing section, an analog to digital conversion (ADC) module, and may also include a filtering and/or gain module. The mixing section converts the desired RF signal 354 into a down converted signal 356 that is based on a receiver local oscillation, such as an analog baseband or low IF signal. The ADC module converts the analog baseband or low IF signal into a digital baseband or low IF signal. The filtering and/or gain module high pass and/or low pass filters the digital baseband or low IF signal to produce a baseband or low IF signal 356 that includes an inbound symbol stream. Note that the ordering of the ADC module and filtering and/or gain module may be switched, such that the filtering and/or gain module is an analog module.

The receiver processing module 344 processes the baseband or low IF signal 356 in accordance with a millimeter wave protocol, either standard or proprietary, to produce inbound data 360 such as probe data received from a probe device or devices (not shown). The processing performed by the receiver processing module 344 can include, but is not limited to, digital intermediate frequency to baseband conversion, demodulation, demapping, depuncturing, decoding, and/or descrambling.

In an embodiment of the present invention, receiver processing module 344 and transmitter processing module 346 can be implemented via use of a microprocessor, microcontroller, digital signal processor, microcomputer, central processing unit, field programmable gate array, programmable logic device, state machine, logic circuitry, analog circuitry, digital circuitry, and/or any device that manipulates signals (analog and/or digital) based on operational instructions. The associated memory may be a single memory device or a plurality of memory devices that are either on-chip or off-chip. Such a memory device may be a read-only memory, random access memory, volatile memory, non-volatile memory, static memory, dynamic memory, flash memory, and/or any device that stores digital information. Note that when the processing devices implement one or more of their functions via a state machine, analog circuitry, digital circuitry, and/or logic circuitry, the associated memory storing the corresponding operational instructions for this circuitry is embedded with the circuitry comprising the state machine, analog circuitry, digital circuitry, and/or logic circuitry.

While the processing module 344 and transmitter processing module 346 are shown separately, it should be understood that these elements could be implemented separately, together through the operation of one or more shared processing devices or in combination of separate and shared processing.

In another embodiment, the receiver and transmitter may share a multiple input multiple output (MIMO) antenna structure, diversity antenna structure, phased array or other controllable antenna structure that includes a plurality of antennas and other RF transceivers similar to RF transceiver 325. Each of these antennas may be fixed, programmable, and antenna array or other antenna configuration. Also, the antenna structure of the wireless transceiver may depend on the particular standard(s) to which the wireless transceiver is compliant and the applications thereof.

FIG. 4 illustrates a simple two antenna MIMO structure. A transmitting (Tx) unit 400 is shown having two antennas 401, 402, while a receiving (Rx) unit 403 is shown having two antennas 404, 405. It is to be noted that both transmitting unit 400 and receiving unit 403 are generally both transceivers, but are shown as separate Tx and Rx units for exemplary purpose in FIG. 4. That is, Tx unit 400 is transmitting data and Rx unit 403 is receiving the transmitted data. The transmitted data symbols at antennas 401 ($Tx_0$), 402 ($Tx_1$) are noted as $S_0$ and $S_1$, respectively. The received data symbols at antennas 404 ($Rx_0$), 405 ($Rx_1$) are noted as $Y_0$ and $Y_1$ respectively. Since the example illustrates a two transmit antenna/two receive antenna MIMO system, the four resulting RF signal paths are noted as $H_{00}$, $H_{01}$, $H1_{10}$, and $H_{11}$ (using the $H_{Tx-Rx}$ notation) and the data path is referred to as channel H. While, the example illustrated is a two antenna structure, the embodiments disclosed herein may operate within other known antenna configurations (e.g., 2×4, 2×8, 4×16, etc.)

Further details including optional functions and features of the RF transceiver are discussed in conjunction with FIGS. 5-18 that follow.

Figure 5:
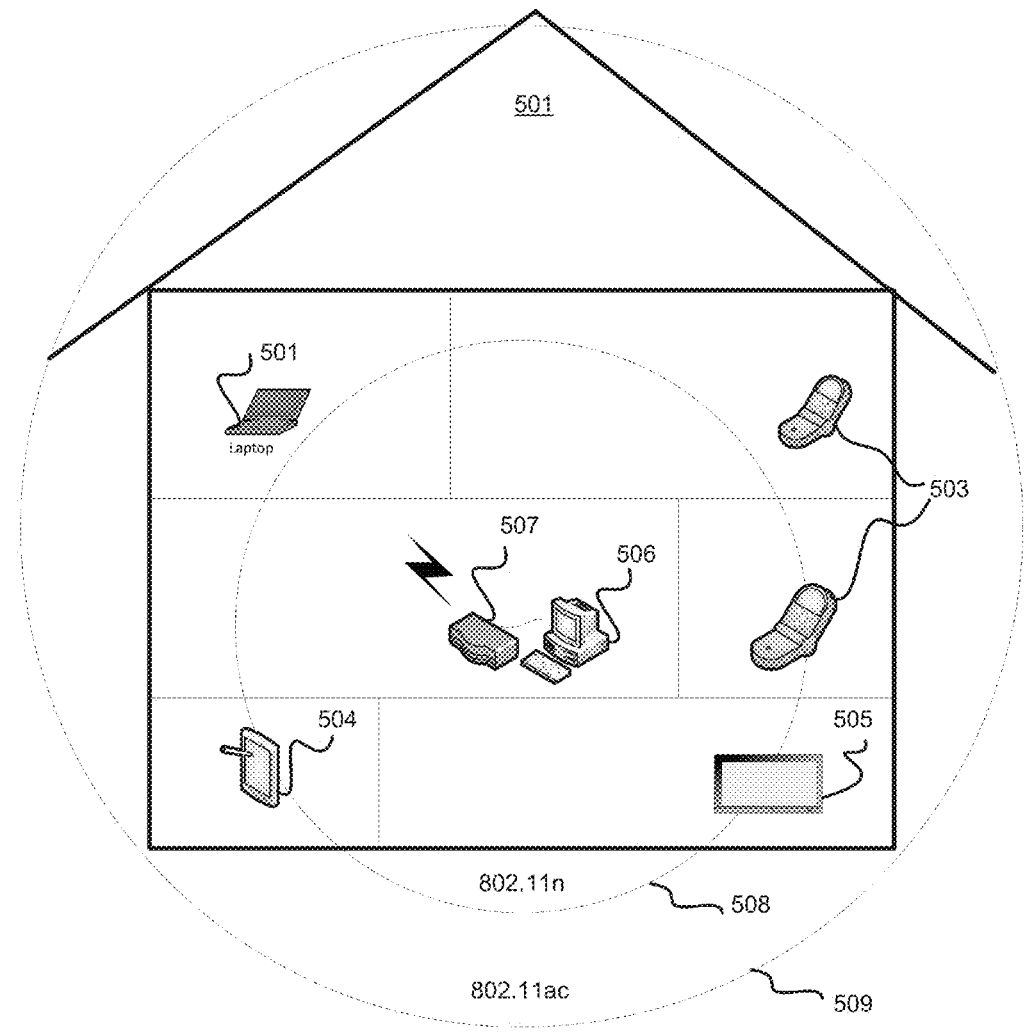
FIG. 5 illustrates one embodiment of a home or building structure (premises) with one or more devices, wired or wireless, connected on a home network (802.11n or 802.11ac)

5G WiFi is the next generation Wi-Fi standard for today's mobile and video era. Based on 802.11ac (5G WiFi) is a major evolutionary step from the existing 802.11a/b/g/n networks. As shown in FIG. 5, the new technology allows for more reliable whole home coverage, 5G WiFi technology overcomes the digital content and wireless device challenge and will allow consumers to stream digital content between devices faster, and simultaneously connect more wireless devices to home and enterprise networks, while conserving battery power. Explosive growth of content consumption coupled with proliferation of wireless devices has created a need for faster and more reliable ways to access content across devices anytime, anywhere. 5G WiFi is ideal and superior to 802.11a/b/g/n based on its reliability—it delivers faster throughput, higher capacity, broader coverage and longer battery life. The new IEEE 802.11ac chips are three times faster and up to six times more power efficient than equivalent 802.11n solutions.

As shown in FIG. 5, a home or building structure (premises) 501 may have one or more devices, wired or wireless (e.g., laptops 502, smart phones 503, tablets 504, web-enabled TVs 505, PCs 506, and other devices, etc.) connected on a home network. Internet services (e.g., broadband or high speed broadband) are provided to the premises over wired (e.g., telephone, fiber, satellite, or cable) or wireless (e.g., 3G, 4G, etc.) networks. Router 507, typically connected to a PC or WiFi hotspot, will control connection of the various devices to the internet using the 802.11ac protocol 509. In the past, other variations of the 802.11 standard have been used. While 802.11n 508 and others were successfully used, they had limited range and throughput and were susceptible to noise-reduced quality at the edge of the transmission/reception range making high speed whole home clear connectivity a challenge.

By creating more reliable whole-home coverage, 5G WiFi technology overcomes the digital content and wireless device challenge. 5G WiFi solutions support one or more the following features:

- 80 MHz channel bandwidth that is 2 times wider than current 802.11n solutions
- 256-QAM, a higher modulation scheme that increases data transfer efficiency
- Transmit and receive beamforming
- Low Density Parity Check (LDPC) Codes
- Space-Time Block Codes (STBC)
- PCIe interface and implementation of 3-stream 802.11ac specifications, with speeds up to 1.3 Gbps
- 2-stream 802.11ac specification to reach up to 867 Mbps
- Support for the USB interface
- speeds of up to 433 Mbps with single stream 802.11ac implementation
- Chips with the PCIe interface are ideal for access points, routers, DSL/cable gateways and PC products; chips that use USB are ideal for consumer electronics devices including televisions, set-top boxes and Blu-Ray players
- 5G WiFi chips deliver better coverage and longer battery life in a small form factor that is interoperable and compatible with existing technologies
- Beamforming helps steer content in the direction of the intended receiver, increasing reliability and extending range
- By transferring the same volume of data at a much faster rate, devices go into a low-power mode faster than existing 802.11n solutions
- Designed on 40 nm manufacturing process, the new chips are smaller and more power efficient, giving customers more design freedom.

5G WiFi solutions work with all legacy 802.11 standards and complement other wireless technologies—like Wi-Fi Direct, Bluetooth and NFC.

While 802.11ac provides superior speed and data transfer capabilities, it is advantageous in backward compatible embodiments to include, for example, capabilities for the 802.11n standard. 802.11ac, in one embodiment, includes a 2.5V power supply for voltage controlled oscillator (VCO) LC tank circuitry. 802.11n, in one embodiment, includes a 1.5V power supply for LC tank circuitry. What is needed is a common circuit (e.g., VCO) that switches between 2.5V and 1.2V power supplies to satisfy requirements for both 11ac and 11n without wasting power in 11n mode.

A tank circuit, also known as an LC circuit, can store electrical energy oscillating at its resonant frequency. A capacitor stores energy in the electric field between its plates, depending on the voltage across it, and an inductor stores energy in its magnetic field, depending on the current through it. If a charged capacitor is connected across an inductor, charge will start to flow through the inductor, building up a magnetic field around it and reducing the voltage on the capacitor. Eventually all the charge on the capacitor will be gone and the voltage across it will reach zero. However, the current will continue, because inductors resist changes in current. The energy to keep it flowing is extracted from the magnetic field, which will begin to decline. The current will begin to charge the capacitor with a voltage of opposite polarity to its original charge. When the magnetic field is completely dissipated the current will stop and the charge will again be stored in the capacitor, with the opposite polarity as before. Then the cycle will begin again, with the current flowing in the opposite direction through the inductor.

The charge flows back and forth between the plates of the capacitor, through the inductor. The energy oscillates back and forth between the capacitor and the inductor until (if not replenished by power from an external circuit) internal resistance makes the oscillations die out. Its action, known mathematically as a harmonic oscillator, is similar to a pendulum swinging back and forth, or water sloshing back and forth in a tank. For this reason the circuit is also called a tank circuit. The oscillation frequency is determined by the capacitance and inductance values used. Typical tuned circuits in electronic equipment include oscillations that are very fast—thousands to millions of times per second.

In a one or more embodiments described herein, a bias loop is used to program LC tank common mode voltage to allow operation at two different $V_{DD}$'s (supply voltage), and two different tank swings. This also allows lower phase noise through optimizing Ids shape.

Figure 6:
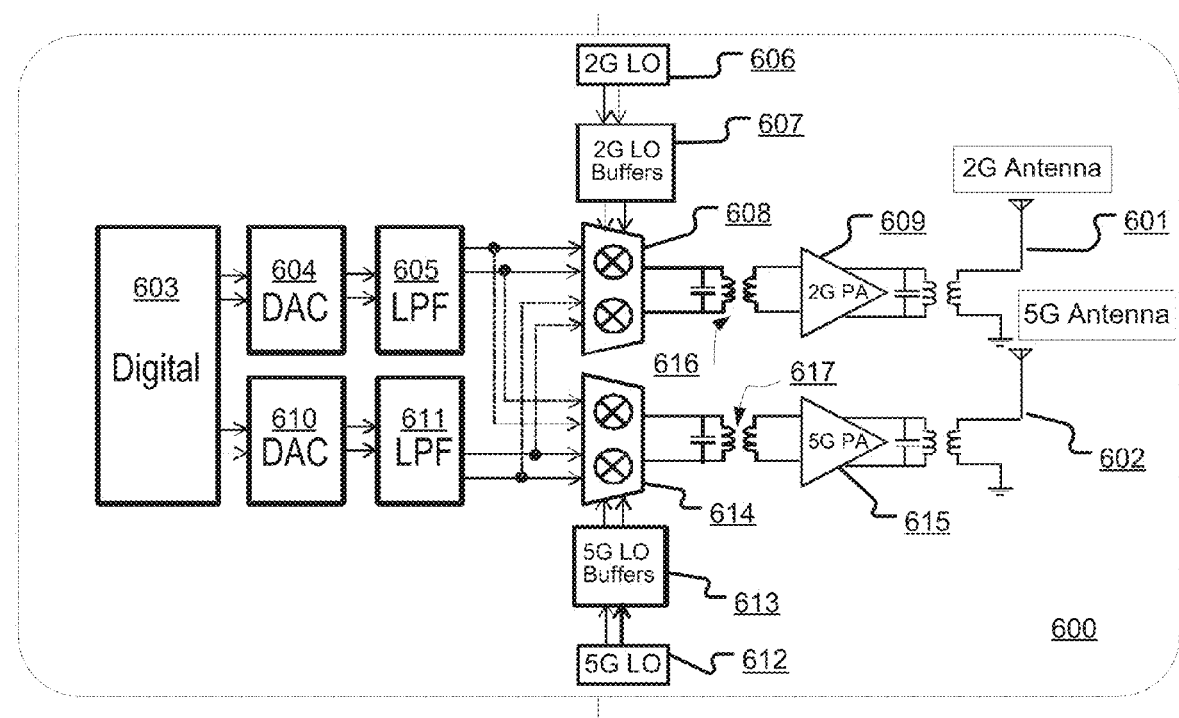
FIG. 6 shows an embodiment of a multi-band transmitter employing mixers and corresponding LO buffers for each band.

FIG. 6 shows an embodiment of a multi-band transmitter employing mixers and corresponding LO buffers for each band. In this example, multi-band transmitter 600 includes dual transmission bands centered around 2 GHz and 5 GHz transmitted from antennas 601 and 602, respectively. The transmission bands are typically around 40+MHz wide. However, the number of bands, frequencies selected and band width ranges can be modified without departing from the scope of the presently described embodiments. Local oscillators LO2 and LO5 provide the required frequencies for transmission in these bands.

As shown, digital processing input stage(s) 603 produces distinct processing chains to process output distinct digital communication signals (bands). The two processing chains each include a digital-to-analog converter (DAC) 604 and 610 (respectively) producing two analog bands which are low-pass filtered (LPF) by filters 605 and 611. The filtered signals are passed to mixers 608 and 614 which include inputs from local oscillators (LO) 606(2G) and 612(5G) through corresponding LO buffers 607 and 613. The mixers are used to up-convert their respective input communication bands into the desired RF bands, in this example 2 GHz and 5 GHz (respectively). Up-converted RF band signals are passed to tuning stages 616 and 617 and amplification stages (power amplifiers (PA) 609 and 615) and to their respective transmission antennas 601 and 602.

Figure 7:
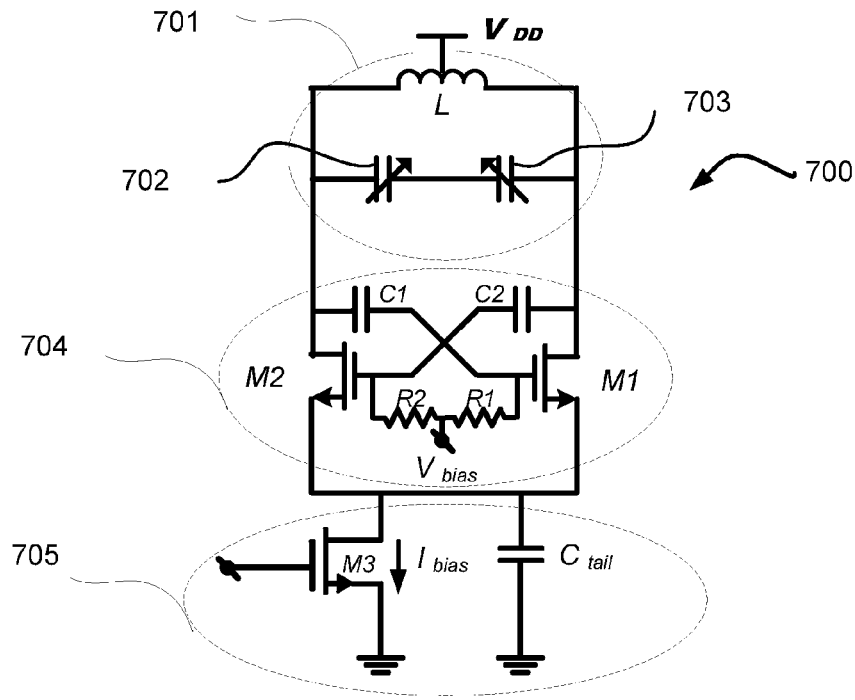
FIG. 7 illustrates one embodiment of a known voltage controlled oscillator (VCO) for a communication transceiver.

FIG. 7 illustrates an embodiment of a known voltage controlled oscillator (VCO) (Mazzanti and Andreani, "Class-C Harmonic CMOS VCOs, With a General Result on Phase Noise," *JSSC* December 2008) for a communication transceiver. VCOs are typically used in the transceiver (element 325 in FIG. 3) to provide proper LO frequencies for up/down conversion modules 348/342. As shown, in one embodiment, a class-C NMOS-coupled VCO, with tail source, includes at least a parallel tank circuit 701 including variable capacitors 702 and 703 and one or more inductors L. Added to the parallel tank circuit is a cross-coupled core with noise reduction (RC low pass filter) 704, including CMOS transistor M1, capacitor C1, and resistor R1 with mirrored CMOS transistor M2, capacitor C2, and resistor R2. At the bottom of the circuit, a tail source 705 includes CMOS transistor M3 with $I_{bias}$, and capacitor $C_{tail}$. A large tail capacitance naturally filters out the high-frequency noise from the tail current. By lowering $V_{bias}$, drain current Id has a lower conduction angle, causing less overlap with impulse sensitivity function (ISF), and therefore less phase noise.

Figure 8:
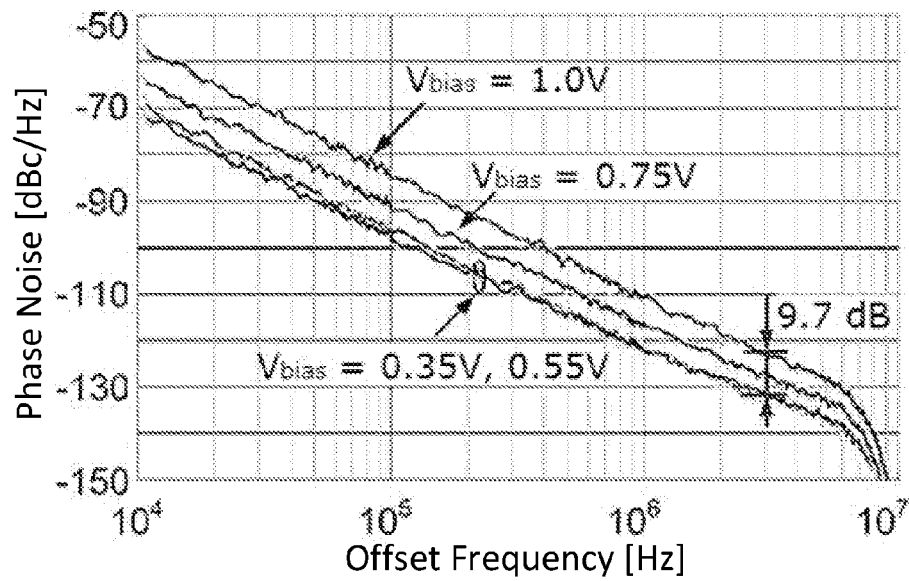
FIG. 8 illustrates one embodiment of the voltage controlled oscillator (VCO) of FIG. 7 with measured phase noise for different values of $V_{bias}$ at a carrier frequency of approximately 5 GHz.

FIG. 8 illustrates the voltage controlled oscillator (VCO) of FIG. 7 with measured phase noise for different values of $V_{bias}$ at a carrier frequency of approximately 5 GHz (qualitatively, the same results are obtained at all carrier frequencies). The phase noise sensitivity to $V_{bias}$ varies greatly with $V_{bias}$ itself. For values of $V_{bias}$ not very far from the nominal 0.35 V, the sensitivity is very low, as demonstrated by an almost constant phase noise for $0.35V<V_{bias}<0.55V$. For higher values of $V_{bias}$, however, the phase noise starts rising quickly, reaching a degradation of 9.7 dB for $V_{bias}=1$ $V=V_{dd}$ (i.e., the value of in the standard implementation of the differential-pair LC-tank VCO).

Figure 9:
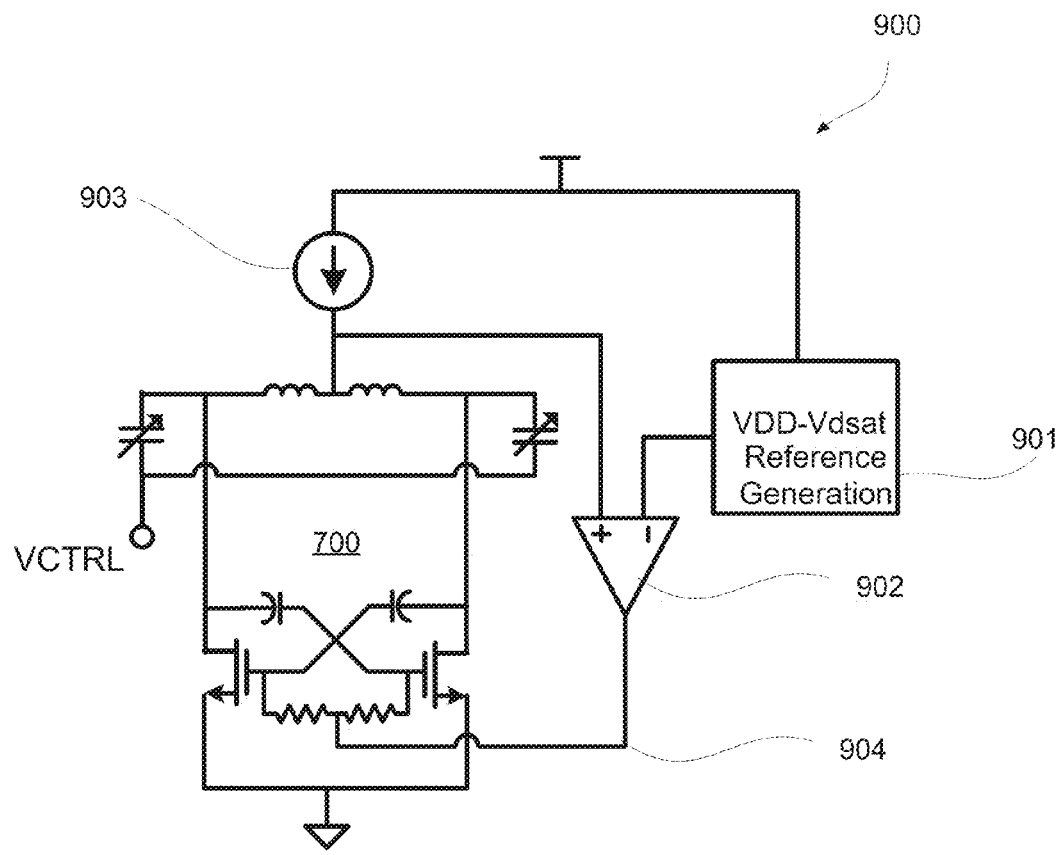
FIG. 9 illustrates one embodiment of the technology described herein which comprises suitable hardware/software in the form of circuitry, logic gates, and/or code that functions to integrate a variable voltage ($V_{DD}$-$V_{dsat}$) reference generator with a Class-C VCO.

FIG. 9 illustrates one embodiment of the technology described herein which comprises suitable hardware/software in the form of circuitry, logic gates, and/or code that functions to integrate a variable voltage ($V_{DD}$-$V_{dsat}$) reference generator with a Class-C VCO 700, an example of which was described in accordance with FIG. 7. The circuit comprises VCO 700, constant current generator 903, power amplifier (PA) 902 and variable voltage ($V_{DD}$-$V_{dsat}$) reference generator 901. As shown, control voltage ($V_{CTRL}$) is ground referenced. Constant current generator 903 provides a current source input to the tank circuit. Lowering the NMOS gate bias (through 904) allows operation as a class-C VCO. The inductor DC level is set at VDD-Vdsat, to achieve maximum tank swing (while keeping tail current alive) over process, voltage and temperature (PVT) variations (PVT corner). A process corner refers to a variation of fabrication parameters used in applying an integrated circuit design to a semiconductor wafer. Process corners represent the extremes of these parameter variations within which a circuit that has been etched onto the wafer must function correctly.

Figure 10:
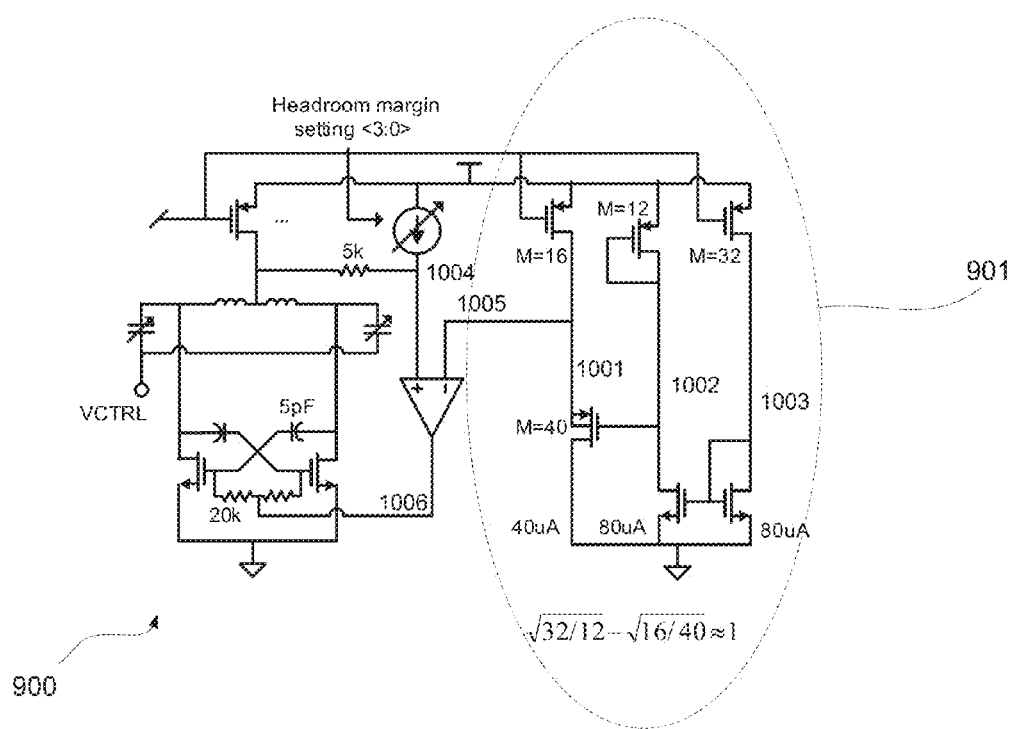
FIG. 10 illustrates one embodiment of the technology described herein which comprises suitable CMOS circuitry to implement the variable voltage ($V_{DD}$-$V_{dsat}$) reference generator 901 as shown and described in accordance with FIG. 9.

FIG. 10 illustrates one embodiment of the technology described herein illustrating suitable CMOS circuitry to implement the variable voltage ($V_{DD}$-$V_{dsat}$) reference generator 901 as shown and described in accordance with FIG. 9. As shown, the variable voltage ($V_{DD}$-$V_{dsat}$) reference generator 901 includes a plurality of selectable paths 1001, 1002, and 1003. Paths 1001 (40 uA) and 1002 (80 uA) create a replica of VCO tail current device (M=12 and M=40) and are used to generate $V_{dsat}$ reference. Through path 1003 (80 uA), transistor M=32 allows headroom margin setting to be adjusted by 50 mV step from 0 to 750 mV. The embodiment as shown provides operation at both 2.5V and 1.2V. In addition, 2.5V is also present in 11n mode to supply various bias circuits. In the bias loop, the NMOS gate settles to 0V (fast-40C), 70 mV (nominal), or 0.45V (slow125C). In fast-40C corner, since NMOS gate is 0V, inductor CM cannot reach $V_{DD}$-$V_{dsat}$ completely. In one embodiment, a degeneration resistor is turned on after "fast settle" mode is off @2 us.

Figure 11:
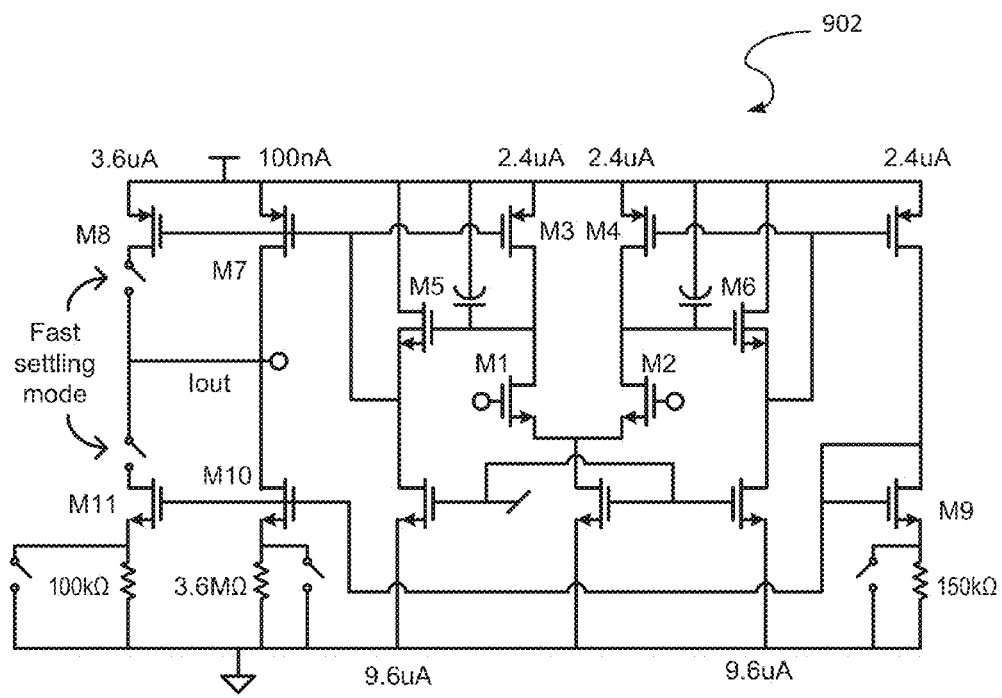
FIG. 11 illustrates one embodiment of the technology described herein which comprises suitable CMOS circuitry to implement a bias error amplifier in conjunction with the variable voltage ($V_{DD}$-$V_{dsat}$) reference generator as per FIGS. 9 and 10.

FIG. 11 illustrates one embodiment of the technology described herein which comprises suitable CMOS circuitry to implement a bias error amplifier—for example, the power amplifier (PA) 902 used in conjunction with variable voltage ($V_{DD}$-$V_{dsat}$) reference generator 901 as shown and described in accordance with FIGS. 9 and 10. As shown, the power amplifier (PA) 902 includes CMOS transistors M1-M11 where M1/2 has low $V_{dsat}$, M3/M4 has high $V_{dsat}$ to provide gain to attenuate noise of bias device (M7, M10 and the 3.6MΩ). Fast settling mode is disabled after loop settles (2 us). Resistor degeneration is provided after 2 us, such that even when the output node goes to 0V, the amplifier still provides high output impedance (>3.6MΩ) to attenuate the Class-C DC bias resistor noise (common-mode portion that becomes close-in phase noise).

With respect to the 2.5V mode, when $I_{trim}$ is small, VCO swing is small, device is small signal and less of Class-C operation, so gate bias is higher; when $I_{trim}$ is medium, VCO swing is large enough to allow device to completely enter Class-C, so gate bias is lowest, and when $I_{trim}$ is further increased, gate bias inevitably increases to maintain LC tank DC level. In the 1.2V mode, tail current $V_{dsat}$ is chosen smaller ($I_b\_ctrl$=10 for 2.5V mode and 6 for 1.2V mode).

Digital tuning the range of the VCO is performed by switching 31 MSB (most significant bits) of a typical digital switch for switchable capacitors, over process/temperature and 1.2V/2.5V modes, with additional tuning range provided by $V_{CTRL}$ varactor and LSB (least significant bit) capacitors.

Figure 12:
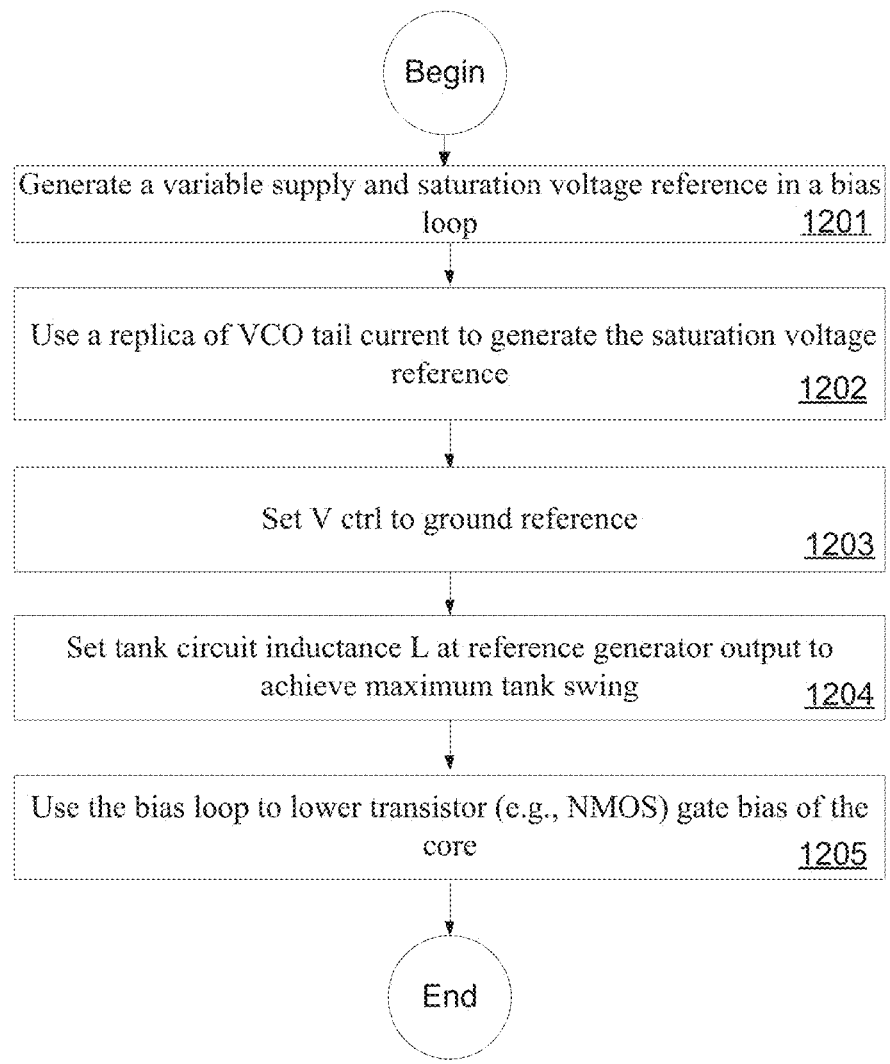
FIG. 12 illustrates one embodiment flow diagram of the technology described herein.

FIG. 12 illustrates one embodiment flow diagram of the technology described herein. The flow diagram includes steps to program LC tank circuit common mode voltage for a voltage controlled oscillator (VCO) to provide operation at two different supply voltages, and two different tank swings. As shown, the steps include generating a variable supply and saturation voltage reference in a bias loop 1201, the saturation voltage reference generated using a replica of VCO tail current 1202; setting V ctrl to ground reference 1203; setting tank circuit inductance L at reference generator output to achieve maximum tank swing 1203, and using the bias loop to lower an NMOS gate bias of the VCO core 1204.

Figure 13:
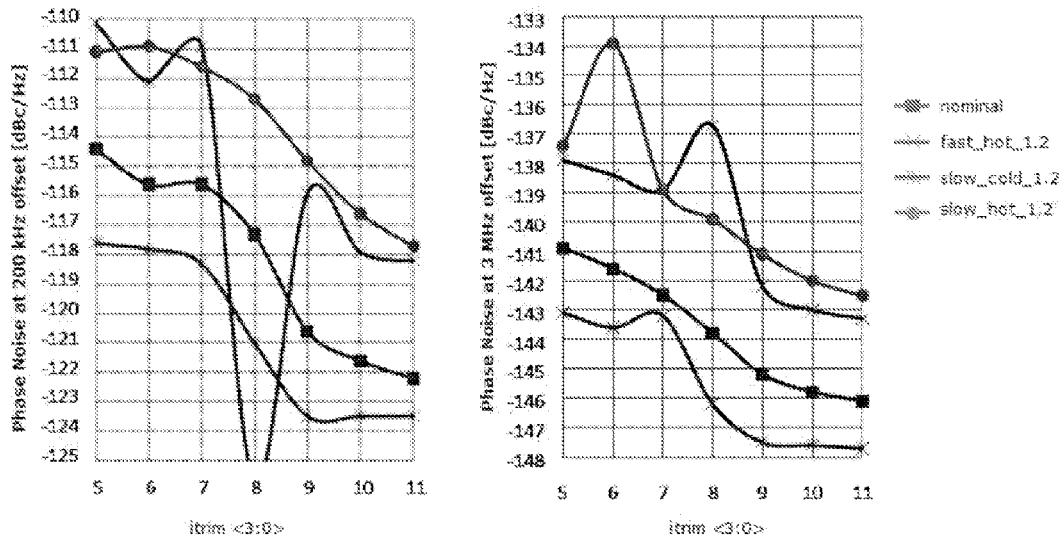
FIG. 13 illustrates a graph of 2.5V mode phase noise vs. VCO current setting.
Figure 14:
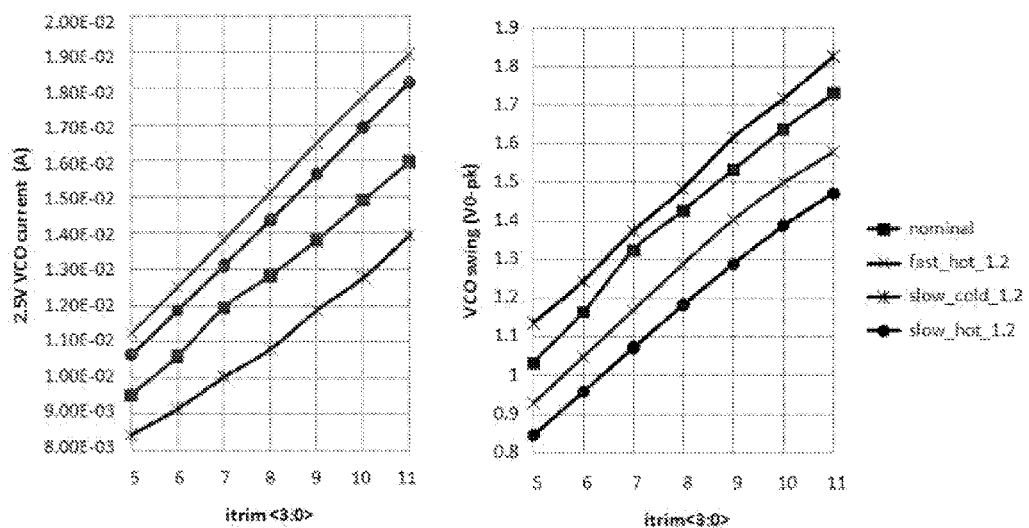
FIG. 14 illustrates a graph of 2.5V mode VCO current and VCO swing.
Figure 15:
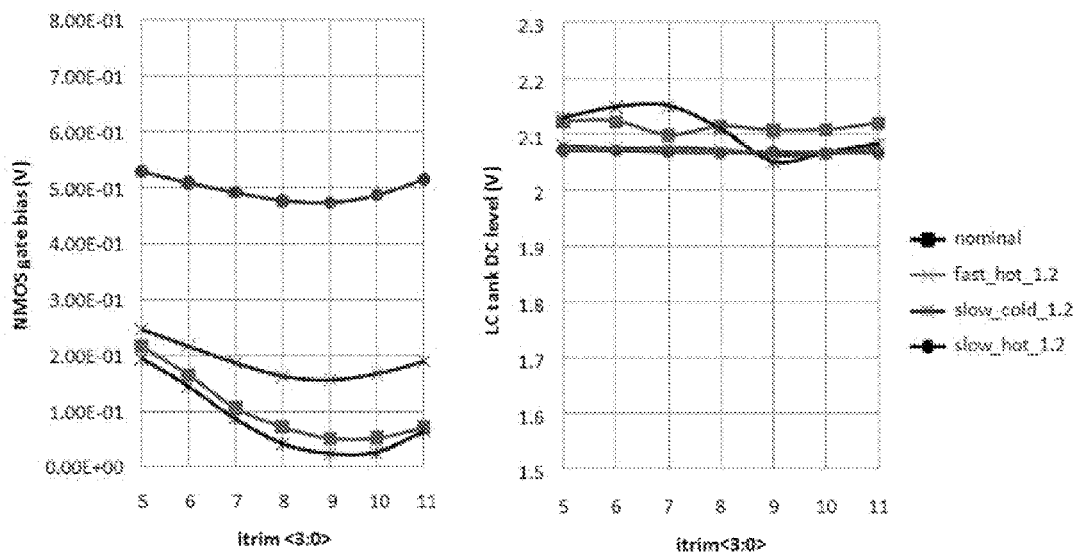
FIG. 15 illustrates a graph of 2.5V mode VCO NMOS gate bias and tank DC level.
Figure 16:
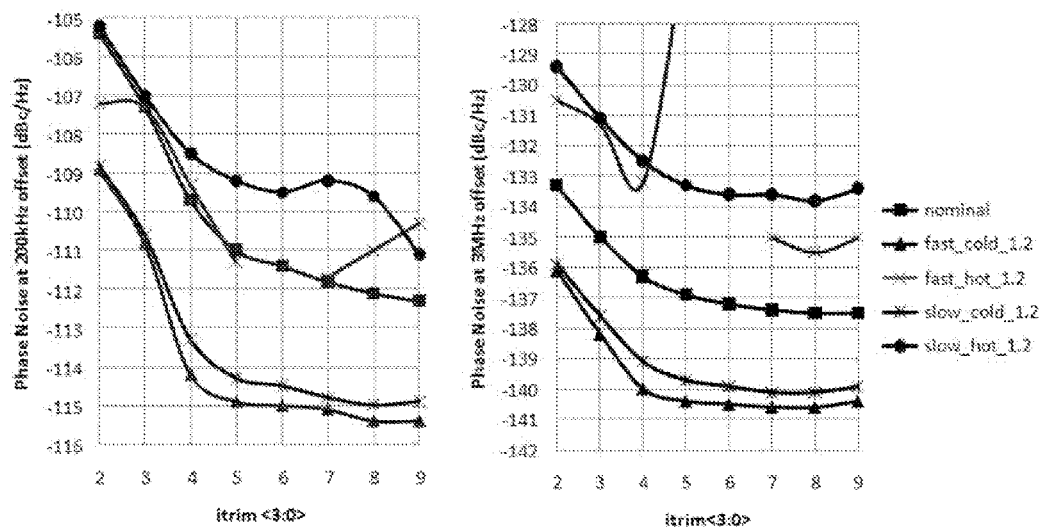
FIG. 16 illustrates a graph of 1.2V mode phase noise vs. VCO current setting.
Figure 17:
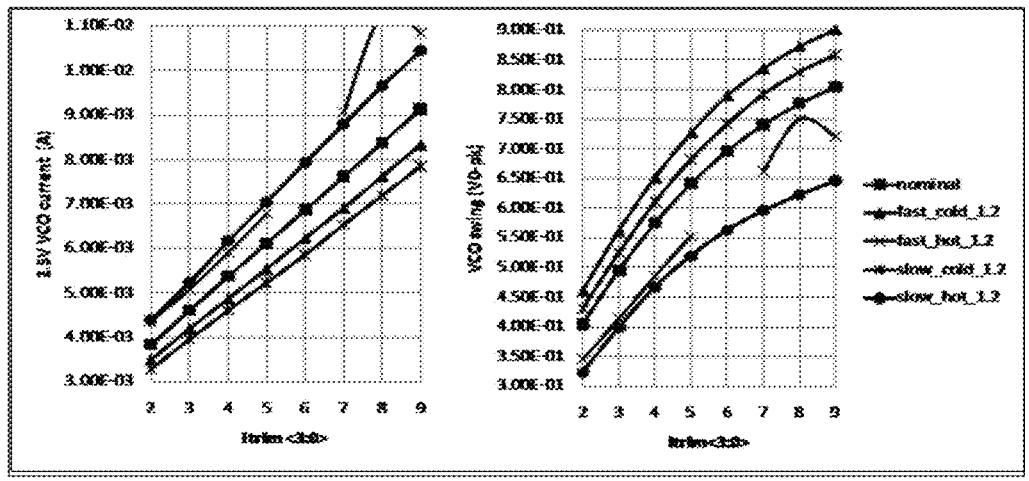
FIG. 17 illustrates a graph of 1.2V mode VCO current and VCO swing.
Figure 18:
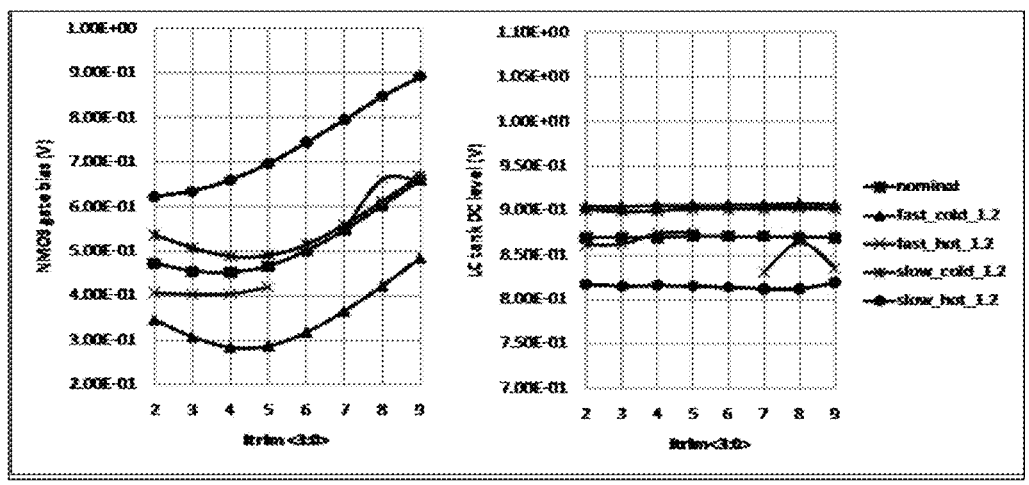
FIG. 18 illustrates a graph of 1.2V mode VCO NMOS gate bias and tank DC level.

FIGS. 13-18 illustrate various graphs of one embodiment of testing of the novel circuit at 1.2 and 2.5 volts. FIG. 13 illustrates a graph of 2.5V mode phase noise vs. VCO current setting; FIG. 14 illustrates a graph of 2.5V mode VCO current and VCO swing; FIG. 15 illustrates a graph of 2.5V mode VCO NMOS gate bias and tank DC level; FIG. 16 illustrates a graph of 1.2V mode phase noise vs. VCO current setting; FIG. 17 illustrates a graph of 1.2V mode VCO current and VCO swing, and FIG. 18 illustrates a graph of 1.2V mode VCO NMOS gate bias and tank DC level.

Throughout the specification, drawings and claims various terminology is used to describe the various embodiments. In telecommunications, the terms multi-band, dual-band, tri-band, quad-band and penta-band refer to a device (especially a mobile phone) supporting multiple radio frequency bands. All devices which have more than one channel use multiple frequencies; a band however is a group of frequencies containing many channels. Multiple bands in mobile devices support roaming between different regions where different standards are used for mobile telephone services. Where the bands are widely separated in frequency, parallel transmit and receive signal path circuits must be provided, which increases the cost, complexity and power demand of multi-band devices.

As may be used herein, the terms "substantially" and "approximately" provides an industry-accepted tolerance for its corresponding term and/or relativity between items. Such an industry-accepted tolerance ranges from less than one percent to fifty percent and corresponds to, but is not limited to, component values, integrated circuit process variations, temperature variations, rise and fall times, and/or thermal noise. Such relativity between items ranges from a difference of a few percent to magnitude differences. As may also be used herein, the term(s) "operably coupled to", "coupled to", and/or "coupling" includes direct coupling between items and/or indirect coupling between items via an intervening item (e.g., an item includes, but is not limited to, a component, an element, a circuit, and/or a module) where, for indirect coupling, the intervening item does not modify the information of a signal but may adjust its current level, voltage level, and/or power level. As may further be used herein, inferred coupling (i.e., where one element is coupled to another element by inference) includes direct and indirect coupling between two items in the same manner as "coupled to". As may even further be used herein, the term "operable to" or "operably coupled to" indicates that an item includes one or more of power connections, input(s), output(s), etc., to perform, when activated, one or more its corresponding functions and may further include inferred coupling to one or more other items. As may still further be used herein, the term "associated with", includes direct and/or indirect coupling of separate items and/or one item being embedded within another item. As may be used herein, the term "compares favorably", indicates that a comparison between two or more items, signals, etc., provides a desired relationship.

As may also be used herein, the terms "processing module", "processing circuit", and/or "processing unit" may be a single processing device or a plurality of processing devices. Such a processing device may be a microprocessor, micro-controller, digital signal processor, microcomputer, central processing unit, field programmable gate array, programmable logic device, state machine, logic circuitry, analog circuitry, digital circuitry, and/or any device that manipulates signals (analog and/or digital) based on hard coding of the circuitry and/or operational instructions. The processing module, module, processing circuit, and/or processing unit may be, or further include, memory and/or an integrated memory element, which may be a single memory device, a plurality of memory devices, and/or embedded circuitry of another processing module, module, processing circuit, and/or processing unit. Such a memory device may be a read-only memory, random access memory, volatile memory, non-volatile memory, static memory, dynamic memory, flash memory, cache memory, and/or any device that stores digital information. Note that if the processing module, module, processing circuit, and/or processing unit includes more than one processing device, the processing devices may be centrally located (e.g., directly coupled together via a wired and/or wireless bus structure) or may be distributedly located (e.g., cloud computing via indirect coupling via a local area network and/or a wide area network). Further note that if the processing module, module, processing circuit, and/or processing unit implements one or more of its functions via a state machine, analog circuitry, digital circuitry, and/or logic circuitry, the memory and/or memory element storing the corresponding operational instructions may be embedded within, or external to, the circuitry comprising the state machine, analog circuitry, digital circuitry, and/or logic circuitry. Still further note that, the memory element may store, and the processing module, module, processing circuit, and/or processing unit executes, hard coded and/or operational instructions corresponding to at least some of the steps and/or functions illustrated in one or more of the Figures. Such a memory device or memory element can be included in an article of manufacture.

The technology as described herein has been described above with the aid of method steps illustrating the performance of specified functions and relationships thereof. The boundaries and sequence of these functional building blocks and method steps have been arbitrarily defined herein for convenience of description. Alternate boundaries and sequences can be defined so long as the specified functions and relationships are appropriately performed. Any such alternate boundaries or sequences are thus within the scope and spirit of the claimed invention. Further, the boundaries of these functional building blocks have been arbitrarily defined for convenience of description. Alternate boundaries could be defined as long as the certain significant functions are appropriately performed. Similarly, flow diagram blocks may also have been arbitrarily defined herein to illustrate certain significant functionality. To the extent used, the flow diagram block boundaries and sequence could have been defined otherwise and still perform the certain significant functionality. Such alternate definitions of both functional building blocks and flow diagram blocks and sequences are thus within the scope and spirit of the claimed invention. One of average skill in the art will also recognize that the functional building blocks, and other illustrative blocks, modules and components herein, can be implemented as illustrated or by discrete components, application specific integrated circuits, processors executing appropriate software and the like or any combination thereof.

The technology as described herein may have also been described, at least in part, in terms of one or more embodiments. An embodiment of the technology as described herein is used herein to illustrate an aspect thereof, a feature thereof, a concept thereof, and/or an example thereof. A physical embodiment of an apparatus, an article of manufacture, a machine, and/or of a process that embodies the technology described herein may include one or more of the aspects, features, concepts, examples, etc. described with reference to one or more of the embodiments discussed herein. Further, from figure to figure, the embodiments may incorporate the same or similarly named functions, steps, modules, etc. that may use the same or different reference numbers and, as such, the functions, steps, modules, etc. may be the same or similar functions, steps, modules, etc. or different ones.

While the transistors in the above described figure(s) is/are shown as CMOS, as one of ordinary skill in the art will appreciate, the transistors may be implemented using any type of transistor structure including, but not limited to, bipolar, field effect (FET) or metal oxide semiconductor field effect transistors (MOSFET), N-well transistors, P-well transistors, enhancement mode, depletion mode, and zero voltage threshold (VT) transistors.

Unless specifically stated to the contra, signals to, from, and/or between elements in a figure of any of the figures presented herein may be analog or digital, continuous time or discrete time, and single-ended or differential. For instance, if a signal path is shown as a single-ended path, it also represents a differential signal path. Similarly, if a signal path is shown as a differential path, it also represents a single-ended signal path. While one or more particular architectures are described herein, other architectures can likewise be implemented that use one or more data buses not expressly shown, direct connectivity between elements, and/or indirect coupling between other elements as recognized by one of average skill in the art.

While particular combinations of various functions and features of the technology as described herein have been expressly described herein, other combinations of these features and functions are likewise possible. The technology as described herein is not limited by the particular examples disclosed herein and expressly incorporates these other combinations.

The invention claimed is:

1. A communications voltage controlled oscillator (VCO) comprising:
    a voltage controlled oscillator (VCO) comprising at least a tank circuit and core;
    a bias loop connected to the voltage controlled oscillator (VCO) comprising:
        a reference generator generating variable supply and saturation voltage sources;
        a constant current source connected to the tank circuit and reference generator;
        a power amplifier with first input connected to the reference generator, second input connected to the constant current source and output connected to the core, and
    wherein the bias loop programs tank circuit common mode voltage to operate the voltage controlled oscillator (VCO) using two or more supply voltages and two or more tank swings by lowering core bias.

2. A communications voltage controlled oscillator (VCO), as per claim 1, wherein the VCO is a class-C VCO.

3. A communications voltage controlled oscillator (VCO), as per claim 1, the tank circuit further comprising a plurality of variable capacitors with control voltage at ground reference and one or more inductors.

4. A communications voltage controlled oscillator (VCO), as per claim 1, the core further comprising a cross-coupled core with noise reducing RC low pass filter and core transistors.

5. A communications voltage controlled oscillator (VCO), as per claim 1, wherein the bias loop lowers gate bias of the core transistors.

6. A communications voltage controlled oscillator (VCO), as per claim 5, wherein the lowered gate bias enables VCO class-C operation.

7. A communications voltage controlled oscillator (VCO), as per claim 1, further comprising setting tank circuit inductance at reference generator output to achieve maximum tank swing.

8. A communications voltage controlled oscillator (VCO), as per claim 1, further comprising using a replica of VCO tail current to generate the saturation voltage reference.

9. A communications voltage controlled oscillator (VCO), as per claim 1, the reference generator further providing flexible headroom margin setting.

10. A communications voltage controlled oscillator (VCO), as per claim 1, wherein the two or more supply voltages comprise 2.5 volts and 1.2 volts.

11. A communications voltage controlled oscillator (VCO), as per claim 1, wherein the two or more supply voltages support both 802.11n and 802.11ac protocols in a common circuit.

12. A communications voltage controlled oscillator (VCO), as per claim 1, wherein the communications voltage controlled oscillator (VCO) is operative in any of: a transmitter, transceiver, user equipment transceiver, base station transceiver, LTE transceiver or MIMO transceiver.

13. A method to program LC tank circuit common mode voltage for a voltage controlled oscillator (VCO) with core to provide operation at two or more different supply voltages, and two or more different tank swings, the method comprising:
generating variable supply and saturation voltage references in a bias loop,
setting tank circuit inductance L at variable supply and saturation voltage reference generator output to achieve maximum tank swing, and
using the bias loop to lower transistor gate bias of the VCO core.

14. A method to program LC tank circuit common mode voltage, as per claim 13, further comprising generating the saturation voltage reference using a replica of VCO tail current and setting control voltage of variable capacitors in the LC tank circuit to ground reference.

15. A method to program LC tank circuit common mode voltage, as per claim 14, wherein the steps of the method allow lower phase noise through optimizing Ids shape.

16. A method to program LC tank circuit common mode voltage, as per claim 13, wherein the lowered core transistor gate bias enables VCO class-C operation.

17. A method to program LC tank circuit common mode voltage, as per claim 13, wherein the steps are operative in any of: a transmitter, transceiver, user equipment transceiver, base station transceiver, LTE transceiver or MIMO transceiver.

18. A method to program LC tank circuit common mode voltage, as per claim 13, wherein the two or more different supply voltages comprise 2.5 volts and 1.2 volts.

19. A method to program LC tank circuit common mode voltage, as per claim 13, wherein the two or more different supply voltages support both 802.11n and 802.11ac protocols in a common circuit.

20. A circuit arranged to operate a high swing voltage controlled oscillator (VCO) at two or more different supply voltages comprising:
a high swing voltage controlled oscillator (VCO) comprising at least a tank circuit and core;
a class C bias loop connected to the voltage controlled oscillator (VCO) comprising:
a reference generator generating variable supply and saturation voltage sources;
a constant current source operatively connected to the tank circuit, reference generator and core;
a power amplifier with inputs connected to the reference generator and constant current source and output connected to the core, and
wherein the class C bias loop operates the high swing voltage controlled oscillator (VCO) at the two or more supply voltages by lowering VCO core transistor gate bias.

* * * * *